(12) United States Patent
Ni et al.

(10) Patent No.: US 11,056,572 B2
(45) Date of Patent: Jul. 6, 2021

(54) SEMICONDUCTOR DEVICE AND METHOD FOR MANUFACTURING THE SAME

(71) Applicant: SUZHOU HAN HUA SEMICONDUCTOR CO., LTD., Jiangsu (CN)

(72) Inventors: Xianfeng Ni, Jiangsu (CN); Qian Fan, Jiangsu (CN); Wei He, Jiangsu (CN)

(73) Assignee: SUZHOU HAN HUA SEMICONDUCTOR CO., LTD., Suzhou (CN)

( * ) Notice: Subject to any disclaimer, the term of this patent is extended or adjusted under 35 U.S.C. 154(b) by 29 days.

(21) Appl. No.: 16/807,633

(22) Filed: Mar. 3, 2020

(65) Prior Publication Data
US 2020/0203506 A1  Jun. 25, 2020

Related U.S. Application Data

(62) Division of application No. 16/407,184, filed on May 9, 2019, now Pat. No. 10,622,456.

(30) Foreign Application Priority Data

May 17, 2018 (CN) .......................... 201810470252.9

(51) Int. Cl.
| | | |
|---|---|---|
| *H01L 29/66* | (2006.01) | |
| *H01L 29/778* | (2006.01) | |
| *H01L 29/06* | (2006.01) | |
| *H01L 21/311* | (2006.01) | |
| *H01L 21/308* | (2006.01) | |
| *H01L 21/265* | (2006.01) | |
| *H01L 29/78* | (2006.01) | |

(52) U.S. Cl.
CPC .. *H01L 29/66462* (2013.01); *H01L 21/26546* (2013.01); *H01L 21/308* (2013.01); *H01L 21/31116* (2013.01); *H01L 29/0603* (2013.01); *H01L 29/778* (2013.01); *H01L 29/7786* (2013.01); *H01L 29/7848* (2013.01)

(58) Field of Classification Search
CPC ... H01L 29/66462; H01L 29/778–7789; H01L 29/205
See application file for complete search history.

(56) References Cited

U.S. PATENT DOCUMENTS

| | | |
|---|---|---|
| 10,388,753 B1 | 8/2019 | Armstrong et al. |
| 2011/0284865 A1 | 11/2011 | Inoue et al. |
| 2013/0032860 A1 | 2/2013 | Marino et al. |
| 2016/0172473 A1 | 6/2016 | Suzuki et al. |

*Primary Examiner* — John A Bodnar
(74) *Attorney, Agent, or Firm* — Westerman, Hattori, Daniels & Adrian, LLP

(57) ABSTRACT

The present application provides a semiconductor device and a method for manufacturing the same. The method includes: sequentially forming a buffer layer and a barrier layer on a substrate, wherein a two-dimensional electron gas is formed between the buffer layer and the barrier layer; etching a source region and a drain region of the barrier layer to form a trench on the buffer layer, and doped layers are formed on the trench; forming a passivation layer on the barrier layer and the doped layers, and etching the passivation layer to expose a portion of the barrier layer, wherein the portion of the barrier layer is in contact with the doped layers; and doping ions into a portion of the buffer layer in contact with the portion of the buffer layer.

8 Claims, 5 Drawing Sheets

SEMICONDUCTOR DEVICE AND METHOD FOR MANUFACTURING THE SAME

CROSS-REFERENCE TO RELATED APPLICATIONS

This is a divisional application of U.S. application Ser. No. 16/407,184, filed on May 9, 2019, which claims benefit of the filing date of Chinese Patent Application No. 201810470252.9, filed on May 17, 2018, the disclosure of which is hereby incorporated in its entirety by reference.

TECHNICAL FIELD

The present invention relates to the field of semiconductor manufacturing, in particular to a semiconductor device and a method for manufacturing the same.

BACKGROUND

As a representative of the third generation of semiconductor materials, gallium nitride (GaN) has many excellent characteristics, such as high critical electric field for breakdown, high electron mobility, high two-dimensional electron gas concentration, and good high temperature working ability, etc. The third generation of semiconductor devices based on gallium nitride, such as high electron mobility transistor (HEMT), heterostructure field effect transistor (HFET), and the like, have been put into use, and have obvious advantages especially in areas requiring high power and high frequency, such as radio frequency and microwave, etc.

For HEMT or HFET devices, a channel conduction from the source to the drain is mainly realized by the two-dimensional electron gas (2DEG) at the interface between aluminum gallium nitride (AlGaN) and gallium nitride (GaN). However, since both AlGaN and GaN are approximate to insulators and have a relatively large contact resistance, the on-resistance of the entire device is large, which limits the application range of the devices.

BRIEF SUMMARY

Therefore, it is necessary to provide a semiconductor device and a method for manufacturing the same to reduce the contact resistance, so as to greatly reduce the on-resistance.

The present invention provides a method for manufacturing a semiconductor device, including:

sequentially forming a buffer layer and a barrier layer on a substrate, wherein a two-dimensional electron gas is formed between the buffer layer and the barrier layer;

etching a source region and a drain region of the barrier layer to form a trench on the buffer layer and forming doped layers on the trench;

forming a passivation layer on the barrier layer and the doped layers, and etching the passivation layer to expose a portion of the barrier layer, wherein the portion of the barrier layer is in contact with the doped layers; and implanting ions into a portion of the buffer layer in contact with the portion of the buffer layer.

Optionally, the step after forming the passivation layer on the barrier layer and the doped layer includes:

etching the passivation layer to also expose a portion of the doped layer, wherein an exposed portion of the barrier layer is in contact with the portion of the doped layer; and implanting ions into the portion of the doped layer and the portion of the buffer layer in contact with the portion of the barrier layer.

Optionally, the step of etching the source region and the drain region of the barrier layer to form the trench on the buffer layer includes:

sequentially forming an insulating dielectric layer and a mask layer on the barrier layer;

forming ohmic contact regions corresponding to the source region and the drain region on the mask layer; and etching the barrier layer and the buffer layer in the ohmic contact regions.

Optionally, the doped layers are n-type doped layers.

Optionally, a source is formed on one of the doped layers, a drain is formed on the other one of the doped layers, and a gate is formed on the barrier layer.

Optionally, the ions are n-type silicon ions or mixed ions of n-type silicon ions, and n-type oxygen ions.

Optionally, an ion doping concentration of the doped layers is greater than $2 \times 10^{19}$ cm$^{-3}$.

Accordingly, the present invention also provides a semiconductor device, including:

a substrate;

a buffer layer and a barrier layer sequentially positioned on the substrate;

a trench formed by etching a source region and a drain region of the barrier layer; and doped layers located in the trench and in contact with the barrier layer;

wherein, the buffer layer includes buffer doped portions that are in contact with the doped layers and the barrier layer.

Optionally, the doped layers include secondary doped portions that are in contact with the buffer doped portions and the barrier layer.

The semiconductor device and the method for manufacturing the same described above can reduce the contact resistance between the two-dimensional electron gas and the doped layers by performing ion doping on a portion of the buffer layer, thereby reducing the on-resistance of the device.

REFERENCE NUMERALS IN THE FIGURES

1—substrate; 2—buffer layer; 3—barrier layer; 4—doped layer; 5—passivation layer; 6 two-dimensional electron gas; 7—source; 8—drain; 9—gate; 11—trench; 21—buffer doped portion; 31-barrier doped portion; 41-secondary doped portion.

DETAILED DESCRIPTION

Hereinafter, a semiconductor device and a method for manufacturing the same proposed by the present invention will be described in further detail with reference to the drawings and specific embodiments. Advantages and features of the present invention will be further clarified by the following description and claims. It should be noted that the drawings that are drawn in a very simplified form not in accordance with the precise scale are only for purposes of conveniently and clearly illustrating embodiments of the present invention.

Embodiment 1

Figure 1:
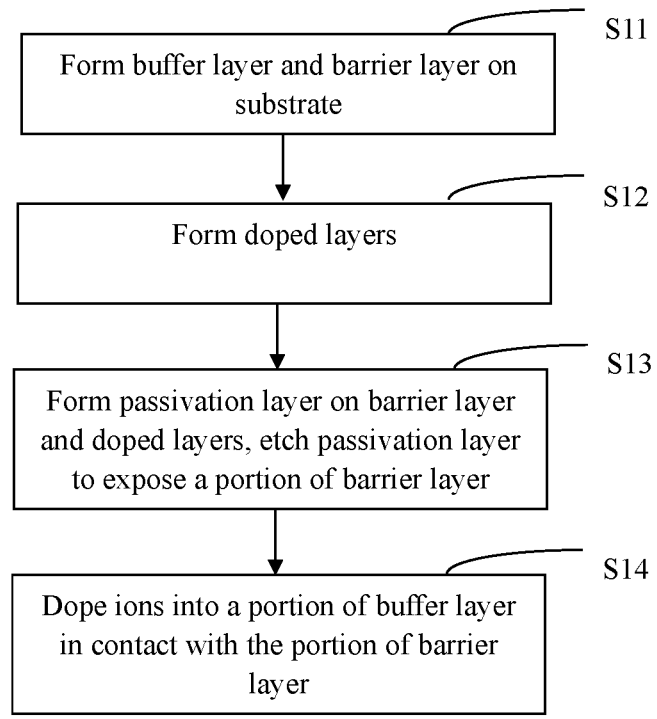
FIG. 1 is a flowchart of manufacturing a semiconductor device according to embodiment 1.

Referring to FIG. 1, a method for manufacturing a semiconductor device provided in this embodiment includes the following steps.

S11: a buffer layer and a barrier layer are sequentially formed on a substrate.

Specifically, the material of the substrate includes, but is not limited to, sapphire, silicon carbide, silicon, diamond, gallium nitride, aluminum nitride and the like. The buffer layer and the barrier layer are stacked together to form a heterojunction, and the surface of the buffer layer near one end of the barrier layer forms a two-dimensional electron gas (2DEG) having high electron density and high electron mobility. A typical heterojunction is AlGaN/GaN, i.e. the buffer layer is GaN and the barrier layer is AlGaN. The buffer layer may also be a nitride such as InN, AlN, AlGaN, InGaN, etc., and the barrier layer may also be a superposition of one or more alloy materials such as InAlN, AlN, ScAlN, etc. The substrate has a thickness of 50 to 1000 micrometers, the barrier layer has a thickness of 3 to 100 nanometers, and the buffer layer has a thickness of 50 to 10000 nanometers. For convenience of explanation, the AlGaN/GaN structure will be described later as an example. It can be understood that such an illustration will not hinder the understanding of this application by those skilled in the art.

S12: a source region and a drain region of the barrier layer are etched to form a trench on the buffer layer and doped layers are formed on the trench.

In order to form a trench on the buffer layer, an insulating dielectric layer may be deposited on the surface of the barrier layer, and a passivation layer is covered on the insulating dielectric layer. Ohmic contact regions and a non-ohmic contact region are formed on the passivation layer by using a photolithography process, and the ohmic contact regions are located on both sides of the non-ohmic contact region. The ohmic contact regions correspond to the source region and the drain region of the barrier layer. Then, the barrier layer in the ohmic contact regions is etched, and after the barrier layer in the ohmic contact regions is etched, a portion of the buffer layer below the barrier layer is further etched, thereby forming a trench on the buffer layer.

After the trench is formed, the doped layers are grown in the trench. The material of the doped layers is the same as that of the buffer layer. In this embodiment, the doped layers are n-type GaN doped layers, and the ion doping concentration of the doped layers is greater than $2\times10^{19}$ cm$^{-3}$. The doped layers have a thickness of 5 to 100 nanometers. The doped layers are in contact with the barrier layer. The doped layers provide tunneling electrons for the source region and drain region which will be later formed on the doped layers to form non-alloy ohmic contacts. However, in order for the device to operate at high frequencies, the on-resistance, which refers to the total resistance between the source region and the drain region, must be as low as possible. In high-frequency devices, the on-resistance is mainly determined by the contact resistance between the doped layers and the electron gas. Therefore, the contact resistance between the doped layers and the electron gas should be further reduced in order to obtain a very low on-resistance.

S13: a passivation layer is formed on the barrier layer and the doped layers, the passivation layer is etched to expose a portion of the barrier layer, and the exposed portion of the barrier layer is in contact with the doped layers.

Specifically, after the passivation layer is deposited on the surfaces of the barrier layer and the doped layers, a mask layer is covered on the passivation layer. Then, a desired pattern is formed on the passivation layer by using a photolithography process. After that, the passivation layer is etched to expose the portion of the barrier layer in contact with the doped layers.

S14: ions are doped into a portion of the buffer layer in contact with the portion of the buffer layer.

Specifically, when performing ion implantation, the doped layers and the unexposed barrier layer will be shielded by the passivation layer due to the passivation layer selection of material and thickness can block ion penetration, and ions can only bombard into the exposed portion of the barrier layer and a corresponding portion of the buffer layer underlying the exposed portion of the barrier layer to be doped into the portion of the barrier layer and the portion of the buffer layer. The portion of the buffer layer is in contact with both the doped layers and the portion of the barrier layer. After the ion implantation is completed, an annealing process is carried out to activate the implanted ions and repair lattice damage caused by ion bombardment, thereby forming buffer doped portions and barrier doped portions in the buffer layer and the barrier layer, respectively.

The method for manufacturing the semiconductor device provided by the present application will be further explained below with reference to FIGS. 2 to 6.

Figure 2:
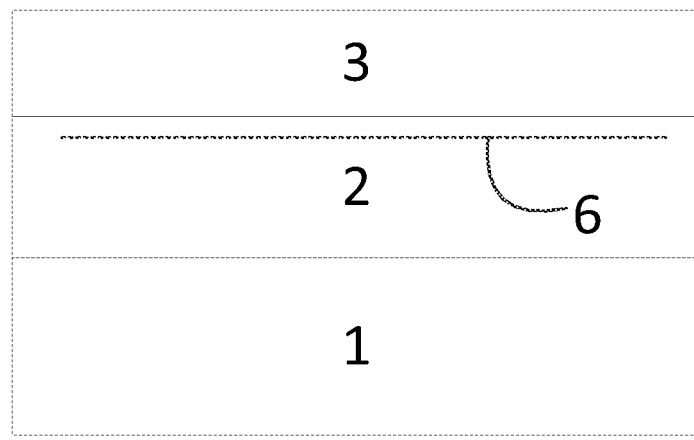
FIGS. 2-7 are structural diagrams in the manufacturing process of the semiconductor device according to embodiment 1.

Specifically, buffer layer 2 and barrier layer 3 are sequentially laminated on substrate 1 to form a structure as shown in FIG. 2. The method of forming buffer layer 2 and barrier layer 3 may be metal organic chemical vapor deposition (MOCVD) or molecular beam epitaxy (MBE).

Figure 3:
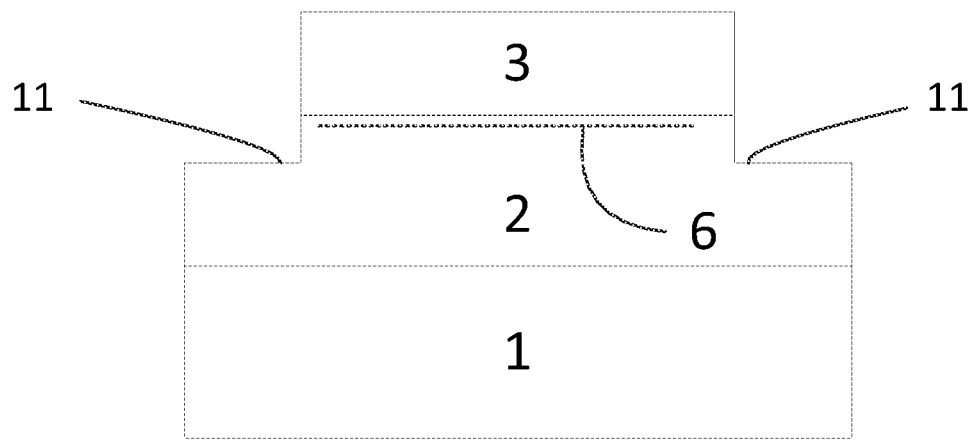

Barrier layer 3 includes a source region, a drain region, and a gate region, which are respectively used for providing a source, a drain and a gate. Due to the large resistance of barrier layer 3, in order to increase the conductivity of the device, the source region and drain region of the barrier layer are etched away, and the underlying buffer layer is over-etched, i.e. a portion of buffer layer 2 is etched away to form trench 11 on buffer layer 2. Trench 11 extends from the surface of barrier layer 3 to the surface of buffer layer 2 to form a structure as shown in FIG. 3. The insulating dielectric layer may be a silicon dioxide layer, a silicon nitride layer, or a silicon dioxide layer plus a silicon nitride layer. The mask layer may be photoresist. The etching may be dry etching or wet etching.

Figure 4:
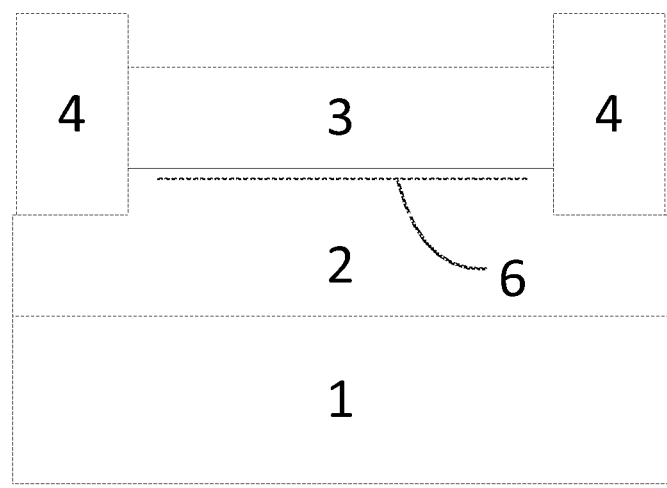

After trench 11 is formed, doped layers 4 may be formed in trench 11 by MBE or MOCVD etc., and then the remaining insulating dielectric layer and mask layer are removed to form a structure as shown in FIG. 4.

Figure 5:
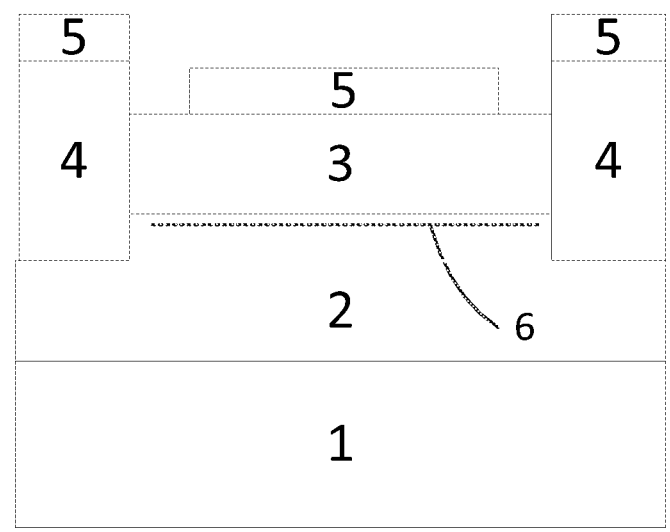

After doped layers 4 are formed, doped layers 4 and barrier layer 3 are covered with passivation layer 5. Passivation layer 5 may be a stack of a dielectric layer and a metal layer (which may be aluminum, copper, etc.). Then, a mask layer is covered on the passivation layer. The mask layer may be a photoresist. A portion to be etched is defined on the mask layer by a photolithography process, and a portion of passivation layer 5 is removed by plasma dry etching, thereby exposing a portion of barrier layer 3 in contact with doped layers 4 to form a structure as shown in FIG. 5.

Figure 6:
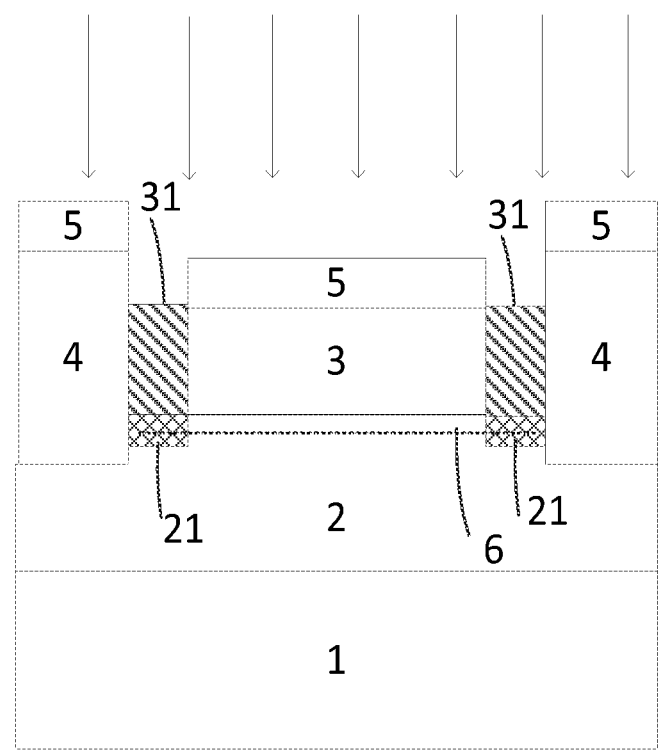

As shown in FIG. 6, the ions bombard the device in a direction indicated by the arrow. The passivation layer can prevent the ions from bombarding the portion covered by the passivation layer to protect the structure under the passivation layer from bombardment, while the structure not covered by the passivation layer will be bombarded by the ions to form an ion doped structure. The ions are n-type ions, which can be silicon ions or mixed ions of silicon ions and oxygen ions. In the process of ion implantation, the energy and dose of the implanted ions are both relatively high. Therefore, in addition to being implanted into the exposed portion of the barrier layer, the ions are also implanted into a corresponding portion of buffer layer 2 underlying the exposed portion of barrier layer 3. Then, an annealing process is performed to form buffer doped portions 21 and barrier doped portions 31 in the buffer layer and the barrier layer. The annealing process may be laser annealing or thermal annealing.

Figure 7:
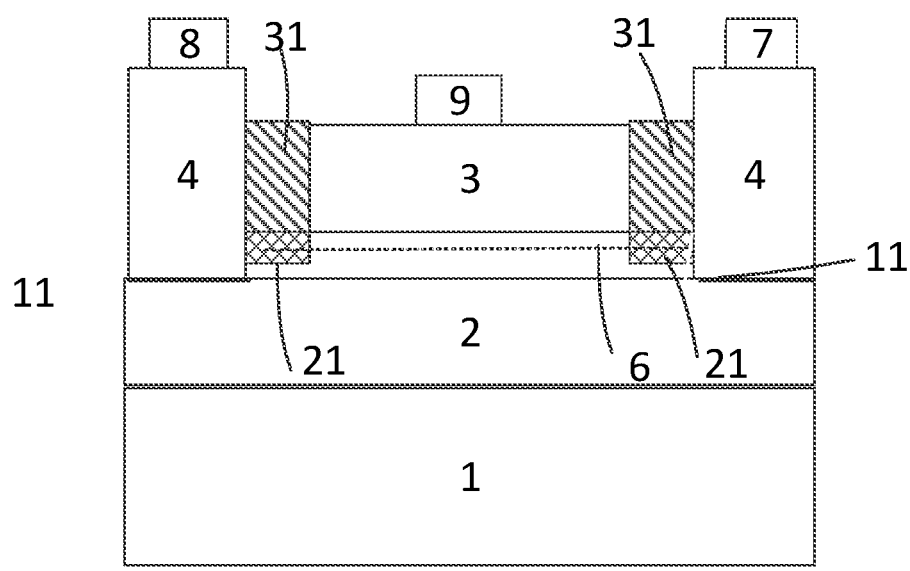

After the ion implantation is completed, the remaining passivation layer 5 and the mask layer are removed by a wet process. Source 7 is formed on one of the doped layers 4, drain 8 is formed on the other one of the doped layers 4, and gate 9 is formed on the gate region of barrier layer 3 to form a device structure as shown in FIG. 7. Source 7 and drain 8 may be an alloy composed of any of titanium, aluminum, nickel and gold. Gate 9 may be a metal stack of nickel/gold or platinum/gold.

In this embodiment, the contact resistance between the electron gas and the doped layers is reduced by performing ion doping on a portion of the buffer layer, thereby reducing the on-resistance of the device.

Embodiment 2

A method for manufacturing a semiconductor device provided by this embodiment is different from embodiment 1 in that after S12, passivation layer 5 is formed on barrier layer 3 and doped layers 4. After passivation layer 5 is etched, a portion of barrier layer 31 and a portion of doped layer 41 are exposed, and the exposed portion of barrier layer 3 is in contact with the exposed portion of doped layer 4. Then, ion doping is performed on the exposed portion of barrier layer 3 and the exposed portion of doped layer 4. Ions are doped into the portion of doped layer 3 and a portion of buffer layer 2 in contact with the portion of barrier layer 4 to form buffer doped portion 21, barrier doped portion 31, and secondary doped portion 41, thus forming a structure as shown in FIG. 8.

Figure 8:
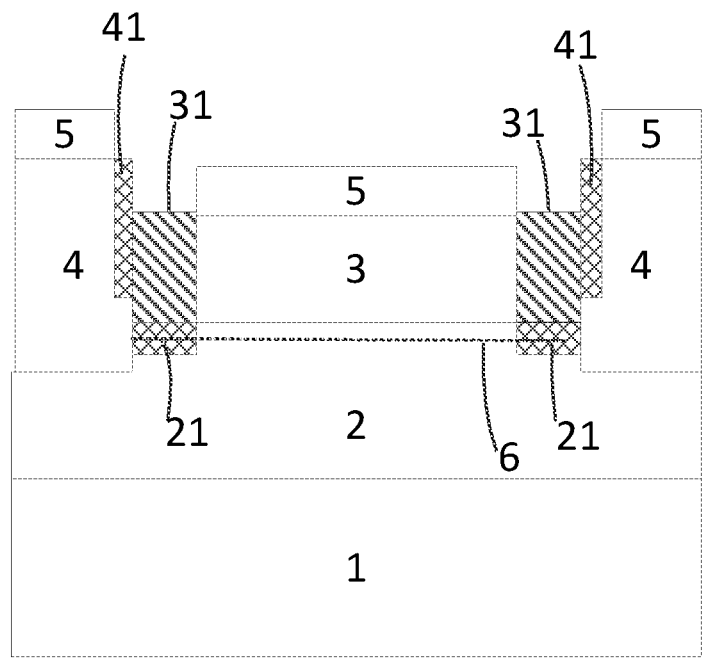
FIGS. 8-9 are structural diagrams in the manufacturing process of the semiconductor device according to embodiment 2.
Figure 9:
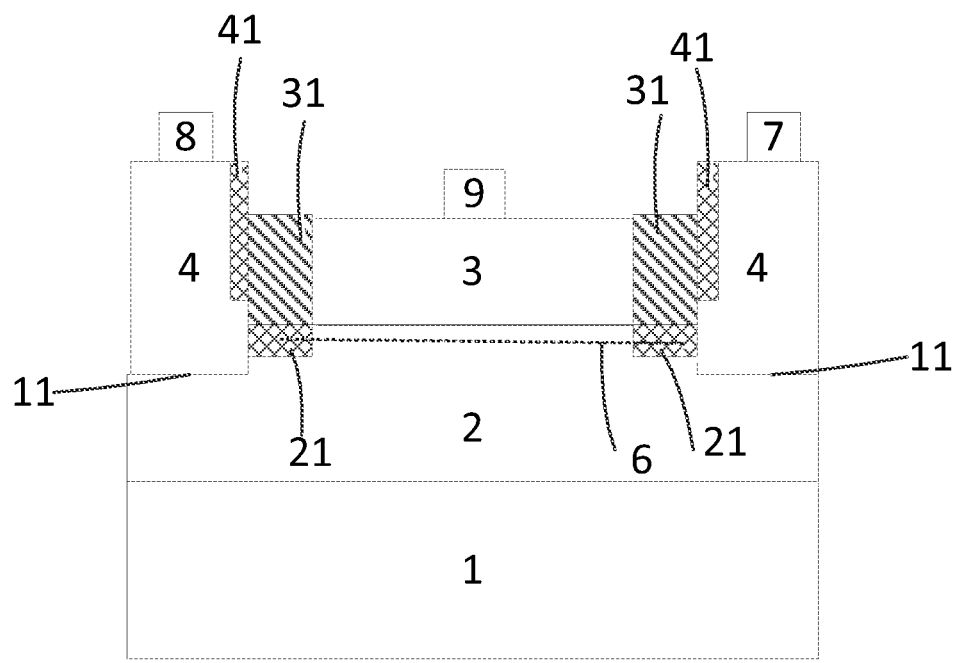

After the structure shown in FIG. 8 is formed, the remaining passivation layer 5 and the mask layer are removed by a wet process. Source 7 is formed on one of the doped layers 4, drain 8 is formed on the other one of the doped layers 4, and gate 9 is formed on the gate region of barrier layer 3 to finally form a device structure as shown in FIG. 9.

Other features of this embodiment are the same as those of Embodiment 1 and will not be described here.

In this embodiment, by performing ion doping on a portion of the buffer layer and by performing secondary ion doping on a portion of the doped layers, the contact resistance between the electron gas and the doped layers is further reduced, thereby reducing the on-resistance of the device.

Embodiment 3

Referring to FIG. 7, a structure of a semiconductor device provided in this embodiment includes:

substrate 1; buffer layer 2 and barrier layer 3 sequentially positioned on the substrate; trench 11 formed on buffer layer 2 by etching a source region and a drain region of barrier layer 3; and doped layers 4 located in trench 11 and in contact with barrier layer 3; wherein buffer layer 2 includes buffer doped portions 21 that are in contact with doped layers 4 and barrier layer 3.

The material of the substrate includes, but is not limited to, sapphire, silicon carbide, silicon, diamond, aluminum nitride, etc.

Buffer layer 2 and barrier layer 3 are stacked together to form a heterojunction, and a surface of buffer layer 2 near one end of barrier layer 3 forms two-dimensional electron gas 6 with high electron density and high electron mobility. A typical heterojunction is AlGaN/GaN, that is, buffer layer 2 is GaN and barrier layer 3 is AlGaN. Buffer layer 2 may be a nitride such as InN, AlN, AlGaN, InGaN, etc., and the barrier layer may also be a superposition of one or more alloy materials such as InAlN, AlN, ScAlN, etc. For convenience of explanation, the AlGaN/GaN structure will be described later as an example. It can be understood that such an illustration will not hinder the understanding of this application by those skilled in the art.

In order to form trench 11 on buffer layer 2, an insulating dielectric layer may be deposited on the surface of barrier layer 3, and a passivation layer is covered on the insulating dielectric layer. Ohmic contact regions and a non-ohmic contact region are formed on the passivation layer by using a photolithography process, and the ohmic contact regions are located on both sides of the non-ohmic contact region. The ohmic contact regions correspond to the source region and the drain region of barrier layer 3. Then, barrier layer 3 in the ohmic contact regions is etched. After barrier layer 3 in the ohmic contact regions is etched, a portion of buffer layer 2 below barrier layer 3 is etched, thereby forming trench 11 on buffer layer 2.

After trench 11 is formed, doped layers 4 are grown in trench 11. The material of doped layers 4 is the same as that of buffer layer 2. In this embodiment, doped layers 4 are n-type GaN doped layers. The n-type GaN doped layers provide tunneling electrons for the source region and the drain region later formed on the n-type GaN doped layers to form non-alloy ohmic contacts. However, in order for the device to operate at high frequencies, the on-resistance, which refers to the total resistance between the source region and the drain region, must be as low as possible. The on-resistance is mainly determined by the contact resistance between the doped layers and the electron gas, so the contact resistance between the doped layers and the electron gas can be reduced in order to obtain a low on-resistance.

The exposed portion of barrier layer 3 and a corresponding portion of buffer layer 2 underlying the exposed portion of barrier layer 3 are ion doped to form buffer doped portions 21 and ion doped portions 31. The buffer doped portions 21 are close to and are in contact with doped layers 4. Buffer doped portions 21 may be formed by ion implantation. The ions are n-type ions, which may be silicon ions or mixed ions of silicon ions and oxygen ions.

The semiconductor device further includes source 7, drain 8, and gate 9. Source 7 and drain 8 are respectively located on doped layers 4, and gate 9 is located on the gate region of barrier layer 3. Source 7 and drain 8 may be an alloy composed of any of titanium, aluminum, nickel, and gold. Gate 9 may be a metal stack of nickel/gold or platinum/gold.

Embodiment 4

Referring to FIG. 9, a structure of a semiconductor device provided in this embodiment includes:

substrate 1; buffer layer 2 and barrier layer 3 sequentially positioned on the substrate; trench 11 formed on buffer layer 2 by etching a source region and a drain region of barrier layer 3; and doped layers 4 located in trench 11 and in contact with barrier layer 3;wherein buffer layer 2 includes buffer doped portions 21 that are in contact with barrier layer 3, and doped layers 4 include secondary doped portions 41 that are in contact with buffer doped portions 21 and barrier layer 3.

The ion concentration of secondary doped portion 41 is greater than that of a portion of doped layer 4 other than secondary doped portion 41.

Other features of this embodiment are the same as those of Embodiment 3 and will not be described here.

In summary, the semiconductor device and the method for manufacturing the same provided by the present application can reduce the contact resistance between the electron gas and the doped layers by performing ion doping on a portion of the buffer layer, thereby reducing the on-resistance of the device.

The technical features of the above-mentioned embodiments can be combined arbitrarily. In order to simplify the description, not all possible combinations of the technical features of the above-mentioned embodiments have been described. However, as long as there is no contradiction in the combination of these technical features, it should be considered as falling within the scope described in this specification.

The above-mentioned embodiments only represent several embodiments of the present invention, and their descriptions are more specific and detailed, but they should not be construed as limiting the scope of the present invention. It should be pointed out that for those skilled in the art, several modifications and improvements may be made without departing from the concept of the present invention, which are all within the protection scope of the present invention. Therefore, the protection scope of the present invention shall be subject to the appended claims.

What is claimed is:

1. A semiconductor device, comprising:
   a substrate;
   a buffer layer and a barrier layer sequentially formed on the substrate, having a two-dimensional electron gas between the buffer layer and the barrier layer;
   trenches in a source region and a drain region, formed by etching through the barrier layer into the buffer layer;
   a doped layer in the trenches;
   wherein an ion implantation forms ion doped regions adjacent to interfaces between the doped layer and the trenches.

2. The semiconductor device according to claim 1, wherein the ion doped regions comprise portions of the barrier and portions of the buffer layer that are adjacent to the interfaces between the doped layer and the trenches.

3. The semiconductor device according to claim 1, wherein the ion doped regions comprise portions of the barrier layer, portions of the buffer layer, and portions of the doped layer that are adjacent to the interfaces between the doped layer and the trenches.

4. The semiconductor device according to claim 1, wherein the doped layer is n-type doped.

5. The semiconductor device according to claim 1, wherein ions used in the ion implantation are n-type silicon ions or mixed ions of n-type silicon ions and n-type oxygen ions.

6. The semiconductor device according to claim 3, wherein an ion concentration of the portions of the doped layer is greater than an ion concentration of other portions of the doped layer.

7. The semiconductor device according to claim 1, wherein a source is formed on the doped layer in the source region, a drain is formed on the doped layer in the drain region, and a gate is formed on the barrier layer.

8. The semiconductor device according to claim 1, wherein an ion doping concentration in the doped layer is greater than $2 \times 10^{19}$ cm$^{-3}$.

* * * * *